(12) United States Patent
Newman

(10) Patent No.: US 8,731,941 B2
(45) Date of Patent: May 20, 2014

(54) VOICE-ACTIVATED MEASUREMENT SYSTEM

(75) Inventor: David Edward Newman, Temecula, CA (US)

(73) Assignee: Zanavox, Temecula, CA (US)

( * ) Notice: Subject to any disclaimer, the term of this patent is extended or adjusted under 35 U.S.C. 154(b) by 506 days.

(21) Appl. No.: 13/220,317

(22) Filed: Aug. 29, 2011

(65) Prior Publication Data
US 2013/0054246 A1 Feb. 28, 2013

(51) Int. Cl.
*G10L 21/00* (2013.01)
*G01G 19/34* (2006.01)

(52) U.S. Cl.
USPC ........................................ 704/275; 177/25.12

(58) Field of Classification Search
USPC .......................... 704/270, 275; 702/173–175; 177/25.11–25.14
See application file for complete search history.

(56) References Cited

U.S. PATENT DOCUMENTS

| | | | |
|---|---|---|---|
| 4,359,604 A | 11/1982 | Dumont | |
| 6,173,060 B1 | 1/2001 | Huang | |
| 7,027,991 B2 | 4/2006 | Alexander | |
| 7,319,961 B2 | 1/2008 | Al-Dhubeib et al. | |
| 7,523,038 B2 | 4/2009 | Ariav | |
| 7,994,439 B2 * | 8/2011 | Daniels et al. | 177/25.13 |

* cited by examiner

*Primary Examiner* — Abul Azad (57) ABSTRACT

A voice-activated instrument performs a measurement and displays the measured value when commanded by voice. The system also resets under voice control. The measurement trigger is any single-syllable command such as "Count" or "Go". The reset trigger is any two-syllable command such as "Reset". Any type of momentary measurement device may be controlled in this way, including time interval measurements, event counting, length measuring, weighing, and electronic metering measurements, and many others.

19 Claims, 6 Drawing Sheets

VOICE-ACTIVATED MEASUREMENT SYSTEM

BACKGROUND OF THE INVENTION

The invention relates to voice-activated systems, and particularly to instruments for making measurements under voice command.

Voice-activated and sound-operated devices are becoming increasingly useful, in applications ranging from lamp dimmers to television remote controls to surgical tools. Some products respond to sound levels, without interpreting the sound as speech. Such non-word-recognizing sound-activated systems include voice recorders, games, and security systems. Other products actually interpret sounds as spoken commands, and respond differently to each recognized command. Voice-controlled phone dialers, GPS systems, alarm clocks, and certain robotic toys perform such word recognition. Even coffee pots now accept a voice command.

Practical data measurement systems, on the other hand, have not kept pace with voice-activation technology. Event counting and interval timing are just two types of measurements that would greatly benefit from a hands-free command capability. Consider a laboratory technician or a researcher handling racks of multiple samples, counting out aliquots of reagents. The worker is constantly counting, necessarily dividing attention between the samples and the tally sheet. A voice-activated counting device would be extremely beneficial. Likewise a retail store must count stock periodically, or an assembly-line worker who has to keep track of how many bolts he has installed on a chassis, or a cook counting out spoonfuls, and innumerable other applications needing a voice-activated counter. Tragically, no such device exists.

A similar deficit is apparent in the area of voice-activated interval timing. For example in sports training, it would be very useful if a time interval could be measured hands-free, using only voice commands. In electronics development and testing, in many areas of research, in psychological testing, and innumerable other situations it would be valuable to measure a time interval by voice. While there are many voice-activated alarm clocks on the market, and some are marketed as "timers", in fact none of them has a stopwatch capability with voice-controlled start and stop function.

Many other measurement instruments would likewise benefit from voice control. Consider a worker measuring a size or distance with a caliper or electronic tape measure, but having difficulty reading the device due to darkness, position, etc. A voice trigger would solve this problem if it locked the measurement on command, to be read later. For weighing, a voice-triggered scale would allow the operator to focus on the load rather than the instrument. For electrical measurements (voltage, current, resistance, frequency, etc.) a measurement could be triggered by voice at the exact moment desired. A voice-triggered digital thermometer would allow the user to lock and hold the temperature reading, when holding the probe upon a specific location. For magnetic field measurements, a voice-activated Gaussmeter would simplify field mapping by allowing the user to lock the measurement at will.

Most voice-activated systems under development today attempt to interpret the meaning of a command. However, word-recognition systems are complex and greatly increase the cost of the application. Usually they require special "training" sessions to calibrate recognition parameters, special microphones and software, and still they make numerous errors. For measurement applications, full word recognition is not necessary because only a couple of basic command functions are needed, for example, "Go" and "Reset". For all these applications, full word recognition is an unnecessary expense.

What is needed is a voice-activated measuring instrument that performs the measurement on spoken command, and resets on spoken command. Preferably the instrument could use an inexpensive and versatile, speaker-independent sound-interpretation strategy rather than word recognition. Such an instrument would have innumerable applications in research, business, sports, and home life.

BRIEF SUMMARY OF THE INVENTION

The invention is a voice-activated system and method to perform a measurement when triggered, and to reset when triggered, by distinct voice commands. The invention recognizes spoken commands as single-syllable (type 1) or double-syllable (type 2) commands. When triggered by a type 1 command, the invention performs the measurement and communicates the measured value. Upon a type 2 command, the invention resets the measured value to zero. The inventive system comprises a sound receiver to convert spoken sounds to electronic signals, a signal analyzer to detect the voice commands and recognize the command type, a measurement device that performs the measurement responsive to type 1 commands, and a communicator to communicate or display the measured value.

The measurement performed by the invention is any determination of a numerical quantity when triggered by the voice command, thereby producing a measured value. The measurement includes any calculations needed to derive the measured value. Examples of the inventive measurement include a tally count, such as the number of voice commands received; a time interval, such as the time interval between successive voice commands; a distance such as a size of an object or a distance between objects; an electronic quantity such as a voltage or current or resistance or frequency or amplitude; a weight or a temperature or an intensity or a field. In each case, the measured value is a numerical value representing the measured quantity at the moment it is measured responsive to the voice command.

The inventive measurement device is any means for performing the selected measurement when triggered by the voice command. When the measurement comprises event counting, the measurement device may be a register in a microcontroller. For interval timing, the measurement device may be a gated clock counter; for length measuring, a caliper with an electronic readout; for weighing, an electronic scale; and likewise for voltage or current or resistance or other electronic parameter measuring, temperature or magnetic field or light level or other environmental parameter measuring, or any other evaluation of a numerical quantity to be made at a specific moment upon a spoken command.

The inventive sound receiver is any transducer that converts the sound of a spoken command into electronic signals. The sound receiver comprises microphones, amplifiers, rectifiers, analog electronic filters, and digital circuits.

The inventive signal analyzer is a circuit that analyzes signals from the sound processor, and recognizes voice commands as single- and double-syllable commands, and then triggers or resets the measurement device. Typically the signal analyzer detects voice commands by comparing the amplified signals to a threshold value, and detects or recognizes a voice command when the signals exceed the threshold, and registers that no sound is present when the signals remain below the threshold. For bipolar signal waveforms, the signal analyzer may compare the signals to two threshold values V+ and V−, recognizing a sound as a command when the signals exceed V+ or go more negative than V−.

The inventive communicator is any means for communicating the measurement result to a user. The communicator may comprise a visual display (such as an LED or LCD display), or an acoustical transmitter (such as a speaker with tones or computer-generated speech), or means for transferring the result electronically to an external system for storage or display or further processing.

The invention recognizes a type 1 command as any single-syllable sound comprising a single brief period of vocalization, such as "Count", "Go", "Stop", and "Lock". The invention recognizes a type 2 command is any two-syllable sound having two voiced periods separated by a brief non-voiced interval, such as "Reset" or "Backup". The signal analyzer treats voiced sounds, and particularly vowel sounds, as command sounds, while any non-voiced speech is treated as silence or background noise. For example the "s" in "Reset" is non-voiced and registers as a brief gap of relative silence between the two voiced syllables in the word. Thus type 2 commands are distinguished by the gap between two voiced sound periods, whereas type 1 commands have a single voiced period.

Many words have multiple syllables. The signal analyzer may recognize a word with three syllables as a type 3 command, and so forth. Or, the signal analyzer may recognize only the first and second voiced periods as a type 2 command, ignoring any remaining sounds. In the latter case, any spoken command with two or more voiced periods separated by non-voiced periods is a type 2 command.

The reset operation typically comprises setting the measured value to zero, although in rare cases the measured value may be set to some other value indicating that the reset has occurred. A reset may include additional operations such as restoring an index or adjusting a threshold value or monitoring any switch changes or transmitting a reset signal to an external system.

The invention includes means for excluding signals outside a frequency range corresponding to voiced command sounds. Non-voiced sounds, such as the "s" in "Reset" and the "t" in "Count", generally have lower sound amplitude and higher frequency than voiced sounds such as vowels. The instrument filters out high frequency signals to prevent the non-voiced sounds from interfering with the command interpretation. Specifically, the invention includes a high-frequency cutoff that is lower than the frequency range of the "t" in "Count", thereby ensuring that the "t" does not register as a second sound pulse. The invention also filters out low frequency signals, below the normal voiced range, coming from drafts and vibrations. Typically the high frequency cutoff is in the range of 500 to 1500 Hz and is accomplished using an inline filter or a feedback capacitor across the amplifier. Typically the low frequency cutoff is in the range of 10 to 100 Hz and is accomplished using a series capacitor through which the signals must pass.

In one aspect, the invention is a voice-activated tally counter, and the measured value is the total count of type 1 voice commands. Upon each type 1 command, the system increments the measured value by one count; and upon each type 2 command, it resets the measured value to zero. The measurement device may be an electronic counter or memory element, which is incremented when the signal analyzer detects a single-syllable command, and which is reset to zero when the signal analyzer detects a double-syllable command.

In one aspect, the invention is a voice-activated interval timer or electronic stopwatch, and the measured value is the time between successive commands of type 1. The time measurement may be performed by gating a counter that counts clock pulses. Clock pulses are electronic pulses from any oscillator or pulse generator producing periodic countable pulses. The circuit may be configured to turn the counter on and off, or to open and close a gate on the clock pulses, upon successive type 1 commands. In either case, the count total is proportional to the time between the commands. The counter may include a scaler so that the displayed value is directly readable in seconds or milliseconds for example. The invention may be configured so that after a time measurement, additional type 1 commands could again start the clock counter, in which case the displayed result is the accumulated time of all the recorded intervals. Or, the invention may ignore any subsequent sounds, thereby freezing the data until reset by a type 2 command. Preferably a type 2 command also stops the counter from counting, if it has started counting.

In one aspect, the invention measures a size or length or distance when triggered by a type 1 command. Examples of voice-triggered distance measuring devices include micrometers and calipers and tape measures with electronic readouts. Typically a user measures the size of an item by holding the measurement device against the item and reading a result. Often it is difficult to read while holding the device in place, due to low light level or an awkward position for instance. But if the user removes the device from the item for easier reading, often the value is disturbed due to the additional motion, and gives a wrong reading. The invention solves this problem by freezing the measurement at a precise moment of the user's choice. The user can then remove the device and read the measured value at leisure, without disturbing the information. Also, it is easy for the user to abort a measurement and start over, simply by speaking a type 2 command to force a reset, and then another type 1 command when ready to measure.

In one aspect, the invention measures a weight when triggered by a type 1 command, and holds the value thereafter until reset. Laboratory scales, postal scales, metering scales, and many other weight measuring devices are included in this category. The invention allows the user to focus on the item being weighed instead of memorizing the result.

In one aspect, the invention measures an electrical parameter such as voltage, current, resistance, frequency, amplitude, and the like. The instrument records the measurement only upon a type 1 command, and resets on a type 2 command. Multimeters and other electronic test meters are in this category.

The invention includes a specific protocol to deal with additional commands occurring after a measurement has been triggered. The invention may respond to further type 1 commands by adding to the measured value. A tally counter, for example, continues accumulating the total count upon each type 1 command. Or, the invention may respond to subsequent type 1 commands by replacing the earlier result with the later result, thereby updating the measured value upon each type 1 command. A voice-activated voltmeter would be of that type. Or, the invention may freeze the first measured value, ignoring further type 1 commands until being reset by a type 2 command (or by a button press). A voice-triggered caliper may use that feature, thereby enabling easier readout.

The invention includes two operational modes, a running mode and a holding mode. In the running mode, triggering of the measurement device is enabled and the system performs the measurement upon a type 1 command and resets upon a type 2 command. In the holding mode, all voice commands are ignored, and the measured value is held unchanged. When the communicator is a visual display, preferably the display continues to show the measured value while in holding mode, but changes the display in a way easily recognizable by the user. For example, in holding mode, the display digits may flash on and off indicating that measurement operations are suspended.

The invention includes means (such as a switch) for turning the device on and off. The invention includes means (such as another switch) for suspending and resuming measurement operations. The invention includes means (yet another switch) for resetting the measured value to zero manually. Alternatively, and preferably, the invention includes a single multifunction switch that combines all the operations of an on-off switch, a run-hold switch, and a manual-reset switch. The multifunction switch is a momentary-type pushbutton switch that, when pressed, causes the instrument to respond differently depending on the state of the instrument and the duration of the press. For example, when the instrument is off, a press of the multifunction switch turns on the power. When the power is on, a brief press of the multifunction switch causes the instrument to toggle between running and holding modes. A longer press triggers a manual reset. An even longer press turns the power off. Such a multifunction switch is convenient and appealing to users.

The invention includes both manual and automatic means for adjusting the acoustical sensitivity. The sensitivity adjustment could be increased to accommodate a user who speaks softly, or decreased to negate a noisy environment. Examples of manual sensitivity adjusting means include a continuously-variable potentiometer and a multi-position click-stop slide switch, wired to attenuate the microphone signal or to modulate the amplifier resistors or to vary a DC level which a microcontroller then interprets as a threshold adjustment. The automatic adjusting means responds to changing background noise levels by monitoring the background noise and adjusting a signal analysis parameter to accommodate the observed level of noise. Preferably the instrument prevents the sound of a command from unduly influencing the adjustment, for example by suspending or retarding the automatic adjustment whenever a voice command is detected. Preferably, the threshold value is not reduced below a predetermined minimum value, even in complete silence.

Since command signals include both plus and minus variations about a mean value, the instrument should react to either positive or negative variations. The invention may rectify the waves, thus rendering all the signal variations positive. The rectified signals may then be integrated or smoothed. Alternatively, the invention may provide both positive and negative thresholds such that sound pulses exceeding the positive threshold, or extending more negative than the negative threshold, are interpreted as a command. Signals remaining between the negative and positive thresholds are interpreted as relative silence.

The invention includes detachable manual-controller means for controlling the measurement operations manually. The controller includes two switches or other manual means for generating signals to control the instrument, one switch simulating a type 1 command and the other simulating a type 2 command. Such a manual control capability may be useful in high noise environments because it would eliminate all background triggering. It would also be useful in environments where the measurement has to be made silently. Preferably, the controller disables the instrument's internal microphone to avoid any background noise triggering the unit. The controller may be connected to the instrument by a cable, or it may communicate commands to the instrument wirelessly using radio or infrared signals for example.

The invention includes a command validation indicator showing when a command has been received, and preferably also showing which type of command. This assures the operator that each command has been properly heard. The indicator may be a visual indicating means such as an LED which is flashed on, or an acoustical indicating means such as the speaker of a headset, in which a tone is produced each time the instrument recognizes a valid command. The indicating means may be different when the command is a type 1 or type 2 command. For a visual indicator, a type 1 could generate a single brief flash, while a type 2 could generate a short train of flashes, thus showing the operator which type of command was recognized. For an acoustical indicator, a single high tone could indicate a type 1, while a short burst of pulses with a lower tone indicates a type 2. In this way the operator knows that the instrument has correctly heard each command, and also catches any background triggers.

The invention may require a brief period of relative silence prior to each command. For example, before accepting any command, the instrument could monitor the background noise level and require that the sound not exceed the threshold level for a predetermined period, Ts, prior to accepting any command. This period of silence ensures that previous commands are finished before accepting a new command. The duration Ts of the period of silence must be long enough that prior commands are finished before the system accepts a new command, but not so long that the system appears balky.

The invention includes a specific timing protocol governing when the selected measurement is performed responsive to a type 1 command. When the first sound is detected, there is no way to know if the command is going to be a single-syllable or double-syllable command. The instrument may be configured to perform the measurement immediately, and then reset if the command turns out to be a type 2. Or, the instrument could wait until after the first sound is complete before performing the measurement, or it could wait until after the entire command interpretation is complete before performing the measurement, or it could perform the measurement after a fixed brief delay. The favored timing strategy depends on the application. The immediate-measurement option has the advantage of responsiveness, but it also causes the display to advance briefly prior to each reset, which can be jarring at first. (This display effect occurs because the first syllable of a type 2 looks like a type 1 command.) For time interval measuring, the fixed delay option is desirable because it avoids the unwanted display advance, while maintaining complete time interval precision (since the same fixed delay is added to both Start and Stop). For distance-measuring applications, it is usually desirable to perform the measurement immediately, since any delay could result in a wrong result due to the device moving during the delay time. For applications involving communication with another computer, it may be best to perform the measurement immediately but wait until the command is complete before communicating the result, so as to avoid confusing the downstream device.

The invention includes signal processing means for distinguishing type 1 commands and type 2 commands based on the temporal distribution of sounds and silent periods. To interpret a spoken command, the invention determines when the first sound pulse is finished and then detects the second sound pulse, if any. The invention determines when the first sound pulse is finished by waiting for a time period Ta of relative silence. If further sound exceeding the threshold is detected therein, the instrument starts the Ta period over. The instrument continues in this fashion until the Ta period expires with no further sound detected. At that point, the first sound is finished. Ta must be long enough to catch all the sound waves of the first syllable, but short enough that it does not also collect the sound of a second syllable. Errors in this process will make a type 1 command register as a type 2 command, and vice versa.

The invention then looks for a second sound pulse within a specific time interval Tg which starts at the end of the Ta period. If no further sound is detected during the Tg period, then the command is a type 1 command. If a second sound pulse is detected anytime during the Tg period, then the command is a type 2. Tg must be long enough to accommodate someone speaking slowly, but not so long that the system readiness is delayed.

The invention includes means for indicating to the operator that it is ready to receive a verbal command. Such a readiness indicator may be an LED for example. While the instrument is processing a command, or waiting for the pre-command period of silence, the readiness indicator is off. When the instrument is in holding mode or performing a reset operation, or whenever any sound is detected, the readiness indicator remains off. The readiness indicator turns on only in running mode, after the silent period is met, before any further sound is detected, and the instrument is ready to receive a verbal command.

The invention includes powering means, which may be a battery or a detachable power supply or a built-in power supply. When the powering means is a battery, the instrument includes means for indicating when the battery is running low, such as an LED that flashes when the battery voltage sags. When the powering means is a detachable power supply, preferably the battery is automatically disconnected when the power supply is attached.

Structurally, the inventive system typically comprises a circuit board in a case. The inventive sound receiver includes a microphone, amplifiers, filters, and rectifiers on the circuit board. The microphone preferably has sufficient sensitivity (at least −30 dB) and the amplifier has sufficient gain (typically 40 to 100 dB) to permit signal analysis. The signal analyzer includes analog or digital electronic means for comparing the signals to threshold values and for measuring time intervals to discriminate type 1 and 2 commands. The sound receiver and signal processor may comprise a single board or separate circuit boards. Separate boards are more expensive but provide improved isolation of the amplifier. While the signal processing can be done with voltage comparators and monostable timers, a much tidier solution is a digital processor such as a microprocessor or microcontroller or gate array.

The inventive measurement device may comprise a portion of the signal processor, or it may be a separate device, depending on the type of measurement. For a tally counting or interval timing measurement, the measurement device is simply a register in the microprocessor. For a distance measuring application, the measurement is performed by a suitable distance measuring device operationally connected to the circuit board.

The inventive communicator may be mounted on the circuit board, such as a visual display, or it may be an external device operationally connected to the circuit board, such as a detachable speaker.

The invention is also a method. The purpose of the method is to perform the measurement responsive to a voice command. The inventive method comprises the following steps:

First, ambient sound is converted into an electrical signal. The signal may be amplified to produce amplified sound signals, the amplification being sufficient that the spoken command can be analyzed, but not so high that oscillations occur. The amplification may include only signals in the frequency band of voiced vowels, and suppress signals with frequencies that are higher or lower than this band. There is usually no need to flatten the spectrum across this band, but resonances should be avoided. The frequency selection may involve analog filtering, or the amplification may be broadband while the unwanted frequency ranges are excluded by analysis, for example using Fourier analysis.

Then, the amplified signals are processed to detect command sounds, by comparing the signals to a predetermined threshold value or values. Command sounds are detected when their signals exceed the threshold. The signal processor may perform further tests such as digitizing, smoothing, differentiating, frequency analyzing, and pattern matching to further detect or identify commands.

The invention waits for a period of relative silence before accepting any command. The silence period has a predetermined duration Ts. If a signal exceeding the threshold occurs during this time, then the interval measurement starts over, and this continues until the Ts period expires with no further signals detected. At that time the system is ready to receive a command. A readiness indicator, if present, is turned on. The period of silence ensures that any subsequent sound is a new command, and not part of some previous activity. Ts is typically 50 to 500 msec.

Then, the invention waits for a first sound pulse exceeding the threshold, which indicates that a voice command has started. When such a sound is detected, the readiness indicator is turned off and the selected measurement is performed. The measurement may be performed immediately when the first sound is detected, or after a fixed delay, or at the completion of the first sound. The particular measurement steps depend on the type of measurement to be performed. For example if the measurement is event counting, then typically an electronic counter is incremented; and if the measurement is a time interval between commands, then a clock counter is started or stopped upon the first sound.

Then, the invention seeks the end of the first command sound by waiting for a time interval Ta during which no further sound is detected above thresholds. Additional sounds during that time are considered part of the first syllable, and the Ta interval is started over. When the Ta period finally expires with no further sound detected, then the command syllable is considered finished. Ta must be long enough to catch all of the sound of a single-syllable command, but not so long as to include both sounds of a double-syllable command. Typically Ta is about 10 to 100 msec.

Then, following the Ta period, the invention seeks a second sound pulse during a time interval Tg. If the Tg interval expires with no further sound detected, then the command was a type 1. If any sound is detected above threshold during Tg, then the command has a second syllable and thus is a type 2 command. When a second sound is detected, the system performs the response function of a type 2 command such as resetting the measured value to zero. Tg must be long enough to catch the second syllable in a slowly-spoken reset command, but short enough that the system returns to a ready state without much delay. Typically Tg is in the range of 50 to 500 msec.

Then, a command validation indicator (if present) such as a LED flash or a tone is generated, and the measured value is communicated to a display or other communication device. The display may be updated as soon as the measured value is obtained, or the display may be updated only after the end of the Tg period. For a visual display, the prompt update version is more responsive. If the measured value is communicated by computer-generated speech, or transmitted to another device, or otherwise processed, it may be better to delay transmission until after the Tg time so that type 1 and type 2 commands are clearly separated.

Then, the invention loops back to the step of waiting for a period of silence Ts before receiving the next command.

The invention provides numerous valuable advantages. It allows a user to perform tedious and distracting measurements easily and hands-free, such as counting and resetting the count. It enables fast time interval measurements, and arguably provides greater precision than any manually controlled measurement. It allows the user to measure a size or distance at a moment of choice, and then read the result later without worrying about the measurement changing. It allows a worker to hold multiple probes on a test circuit while triggering a measurement hands-free. It helps control a weighing process by allowing the user to manage the load rather than focusing on the readout. It greatly simplifies position-dependent measurements such as temperature and light level and field measurements, by allowing the user to register the measurement value at will. Most importantly, it provides all these capabilities using a quick and simple command recognition protocol, which is easily performed by all users without training, and is implemented with extremely low-cost components.

BRIEF DESCRIPTION OF THE FIGURES

FIG. 2 is a sketch of size-measuring embodiments as a caliper (FIG. 2a) and electronic tape measure (FIG. 2b).

FIG. 3 is a sketch of a weighing scale embodiment as a laboratory scale (FIG. 3a) and as an industrial conveyor scale (FIG. 3b).

FIG. 4 is a sketch of an inventive multimeter (FIG. 4a) and a Gaussmeter (FIG. 4b).

DETAILED DESCRIPTION OF INVENTION

Figure 1:
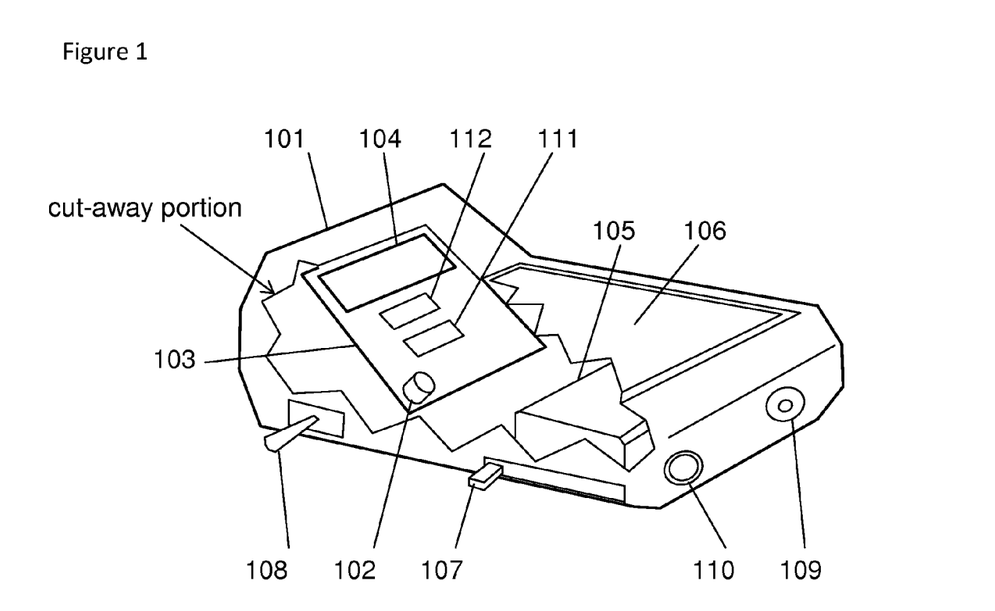
FIG. 1 is a sketch, partly cut away, of an embodiment of the invention as a portable counter or timer instrument.

Referring to FIG. 1, an embodiment according to the invention is an instrument comprising a case 101 (shown partly cut away), a microphone 102, a circuit board 103, and a display 104. The case 101 is a plastic enclosure with an aperture for the display 104, plus a battery 105, a multifunction switch 106, a gain switch 107, a mode switch 108, a communications connector 109 for a detachable microphone (not shown), and a power connector 110 for a detachable power supply (not shown).

The microphone 102 is a small electret transducer such as the CMC-5044PF-A, with sufficient sensitivity (preferably at least −30 dB) in the vocal frequency range to detect spoken commands, and is wired to generate electrical signals related to the command sounds.

The circuit board 103 includes an amplifier 111 which is configured to amplify the signals from the microphone 102, preferably excluding signals having frequencies outside the voiced frequency range. The amplifier 111 may be an LM358 having two op-amps wired as inverting, AC-coupled gain stages in series. The circuit board 103 includes a microcontroller 112 which receives the amplified signals and is programmed to identify the voice commands as type 1 or type 2 based on their sound pulses. Preferably the microcontroller 112 has an ADC capability to digitize the signals. The microcontroller also performs as the measurement device by incrementing a counter within the microcontroller 112, or gating a timer within the microcontroller 112, when so commanded. The microcontroller 112 is also configured to reset the measured value to zero upon a double-syllable voice command. The microcontroller 112 may be a PIC16F690 with an 8.0 MHz crystal clock.

The display 104 is a 4-digit 7-segment common-cathode LED display such as the LTE-4727JR. The microcontroller 112 drives the display 104 by illuminating the segments of one digit at a time, rapidly circulating among the four digits to produce a visually continuous result. The embodiment also provides a low-battery indicator comprising one of the decimal points in the display 104. The microcontroller 112 monitors a voltage line and detects when the power sags, and then illuminates or flashes that decimal point to alert the user that the battery 105 is low. The embodiment also provides a readiness indicator comprising another decimal point in the display 104. When the system is ready to receive a spoken command, following a requisite period of silence, the microcontroller 112 illuminates the readiness indicator, and turns it off as soon as the first command sound is detected. In this way the user knows when the system is ready for a voice command.

The multifunction switch 106 is a tactile switch (a momentary-type pushbutton switch with a snap action that can be felt when pressed) wired to turn the power on when pressed. The microcontroller 112 monitors voltage from the multifunction switch 106 and is programmed to measure the duration of the press and to respond to different press durations accordingly. When the system is running, a brief tap of the multifunction switch enables or disables the measurement function by alternating between the running mode and holding mode. Upon a longer press, lasting about 0.5 seconds, the microcontroller 112 resets the measured value to zero. For an even longer press, lasting about 1.5 seconds, the microcontroller 112 causes the system to power-down.

The gain switch 107 is a 3-position slide switch connected to three attenuators (not shown) and to the microphone 102 so that the signal from the microphone 102 must pass through the attenuator that is selected by the gain switch 107. The gain switch 107 may be mounted on the side as shown, or anywhere of convenience on the case 101. In another embodiment, the gain switch 107 selects either the feedback resistor or the gain-set resistor in the amplifier 111, which accomplishes the same sensitivity variation as the attenuation version although it requires one additional interconnect wire.

The mode switch 108 is a toggle switch connected to the microcontroller 112 to select the type of measurement that is performed. The embodiment shown performs two measurements, a counter measurement and a timer measurement, as selected by the mode switch 108. The mode switch 108 may be mounted on the side, as shown, or anywhere of convenience on the case 101. In different embodiments, the selecting may occur only upon power-up, or the selecting may occur only during a reset operation, or the selecting may occur at any time the user changes the mode switch 108.

The communications connector 109 is a 2.5 mm, 3-conductor, stereo jack which receives a mating plug attached to an external peripheral (not shown), such as a headset or a wireless microphone receiver or a manual controller. The communications connector 109 is wired to the circuit board 103 to convey signals between the circuit board 103 and the peripheral. The communications connector 109 also includes an internal switch (not shown) that disconnects the internal microphone 102 from the circuit board 103 whenever the peripheral is plugged into the communications connector 109, so that the peripheral can control the operation without interference from the internal microphone 102. The communications connector 109 may be mounted on the front, as shown, or elsewhere. The microphone 102 may be mounted on the circuit board 103, as shown, or adjacent to the communications connector 109. Mounting the microphone 102 close to the communications connector 109 usually increases the distance from the microphone 102 to from the amplifier 111, but minimizes the number of interconnects needed.

The power connector 110 is a 2.1 mm, 2-conductor, center-positive coaxial male plug onto which an external 9-volt DC power supply (not shown) can be connected. The power connector 110 includes an internal switch (not shown) that disconnects the battery 105 when the power supply is plugged in. The power connector 110 may be mounted on the front, as shown, or elsewhere on the case 101.

Figure 2A:
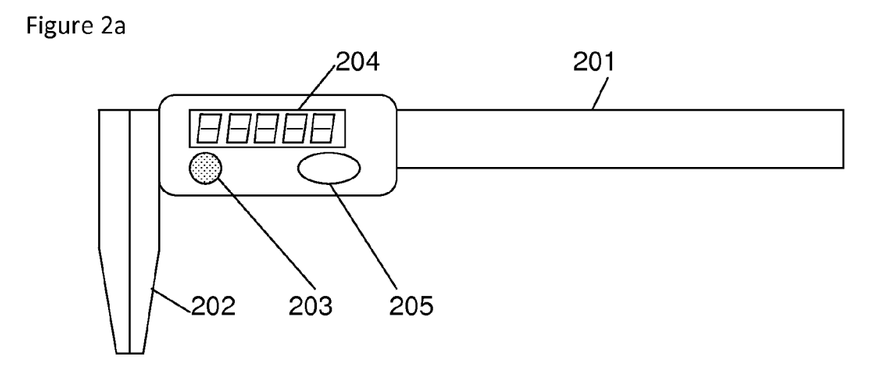

FIG. 2 shows inventive embodiments configured to measure a distance. In FIG. 2a, an electronic caliper 201 measures the size of any item placed between the jaws 202 (shown in the closed position). A microphone 203 receives voice commands. The caliper 201 performs the size measurement continuously, and display it continuously in the display 204, until triggered by a type 1 command, at which point the display 204 is frozen until reset. The result can be zeroed, and the system readied for another measurement, by a type 2 command or using the button 205. The user can easily read the measurement by issuing a type 1 command, and then removing the item from the jaws 202, since the result in the display 204 remains unchanged until reset.

Figure 2B:
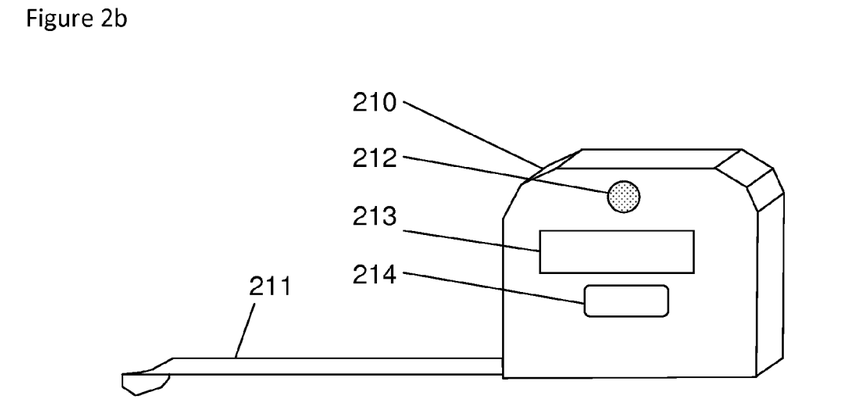

FIG. 2b shows an electronic tape measure 210 configured to measure a distance using the retractable tape 211 and an internal optical-encoder wheel (not shown). A microphone 212 accepts voice commands to trigger the measurement, and a display 213 shows the result. A button 214 toggles between holding mode and running mode.

Figure 3A:
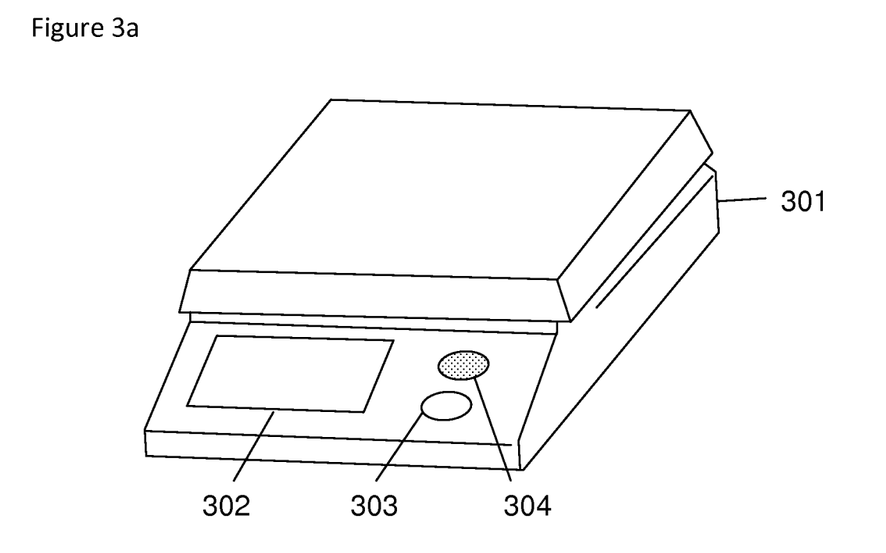

FIG. 3 shows inventive embodiments configured for weighing something. In FIG. 3a, a laboratory scale 301 measures the weight of any item placed thereon and displays the result in the screen 302. A switch 303 causes the scale to "tare" or readjust its zero point, an operation commonly performed before every weighing. A microphone 304 receives voice commands and is configured to trigger a tare adjustment upon each type 2 command, and to lock the weight reading upon each type 1 command. Thus a user can place an empty container on the scale 301, speak "Reset" to tare the container, then add contents to the container, then speak "Lock" to hold the reading which shows the weight of the contents. The user can then remove the container at will, while the net weight remains displayed (until reset by a button 303 press).

Figure 3B:
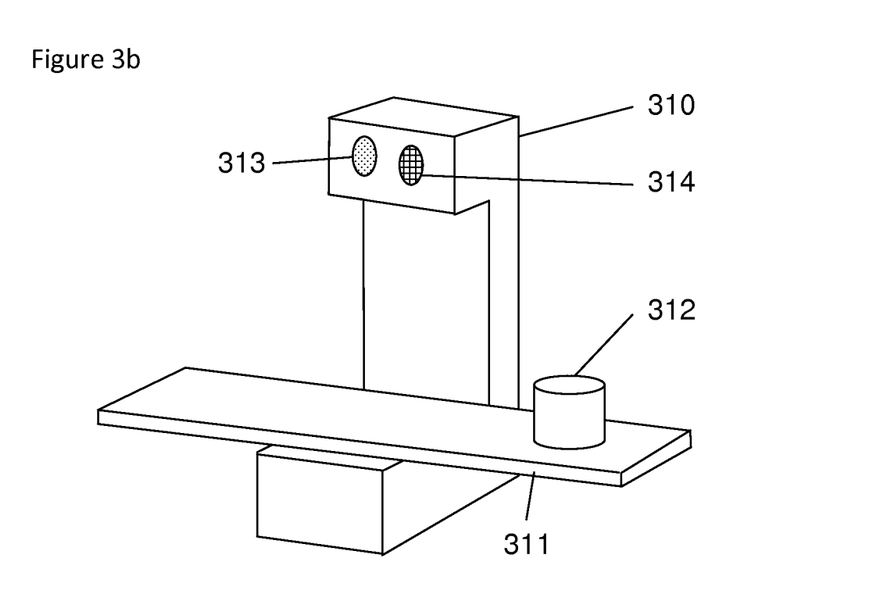

FIG. 3b shows an industrial weighing scale 310 with a conveyor belt 311. The conveyor belt 311 transports an object 312 to the scale 310 for weighing, and then stops. An operator checks the object 312, readjusting its position if necessary, and then speaks a type 1 command into the microphone 313. The type 1 command causes the scale 310 to record the weight in an internal memory, and also to generate an acoustical command-validation signal comprising computer-generated speech using the speaker 314. The computer-generated speech may comprise a standard response such as "measurement completed", or it may convey the measured value as "three point four kilograms". The operator then speaks a type 2 command into the microphone 313, which causes the conveyor belt 311 to start up again, bringing the object 312 to a printer (not shown). The scale 310 communicates the measured value to the printer, which prints the weight on the object 312.

Figure 4A:
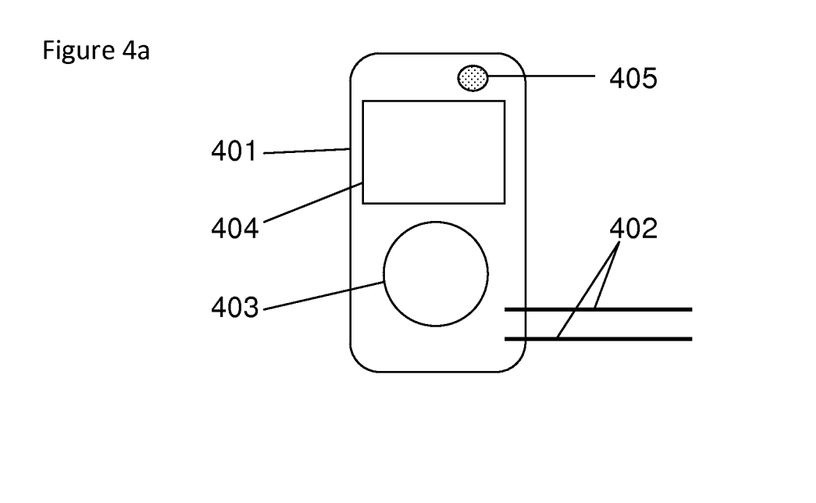

FIG. 4 shows inventive embodiments configured to measure electromagnetic quantities. In FIG. 4a, a multimeter 401 is able to measure voltage, current, resistance, and other electronic values when the leads 402 are contacted to a test circuit (not shown). The particular measurement is selected by a rotatable selector switch 403. The multimeter 401 may also measure temperature using a temperature probe (not shown). The result is displayed on the screen 404. A microphone 405 receives voice commands and, upon each type 1 command, locks the display 404. Upon each type 2 command, the multimeter 401 unlocks the display 404 and resumes performing the measurement. Thus the measured value is held for easy reading, even after the leads 402 have been removed from the test circuit.

Figure 4B:
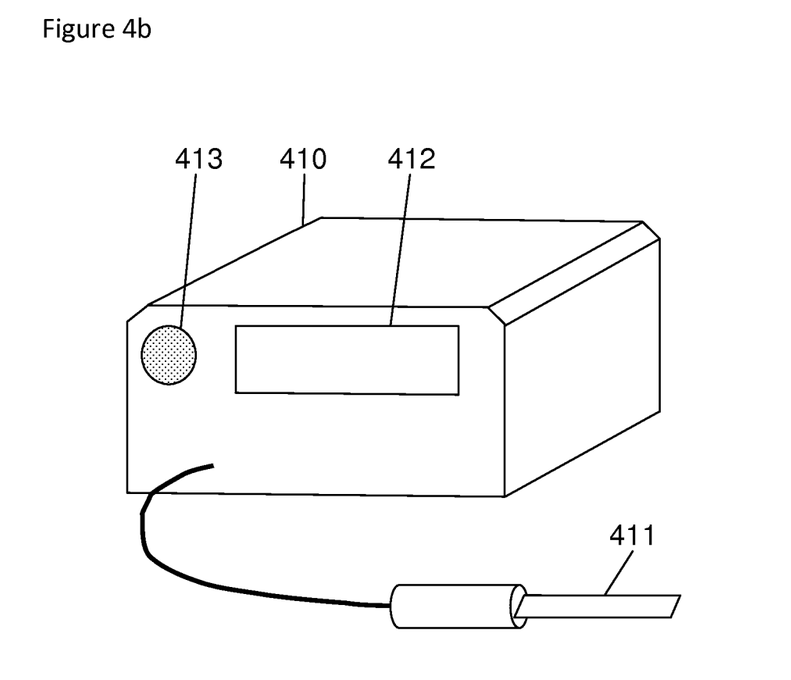

FIG. 4b shows a Gaussmeter 410 which measures magnetic fields passing through the end of a Hall-effect probe 411, and displays the value on a screen 412. As anyone knows who has used such a meter, the displayed value is extremely sensitive to the position and orientation of the probe 411. Typically the operator positions the probe in a magnetic structure, and then reads the display 412 and tries to memorize the reading before it changes. Yes, it's difficult. Fortunately, the invention includes a microphone 413 that locks the display 412 for easy reading or recording upon each type 1 command, and then resumes the measurement upon a type 2 command. Some prior art meters include a peak-detect option that holds the display at the maximum value observed, but this is frequently erroneous due to positioning errors, particularly in a nonuniform field. The invention eliminates the problem by allowing the operator to control exactly when the measurement is taken, by voice command alone.

Figure 5:
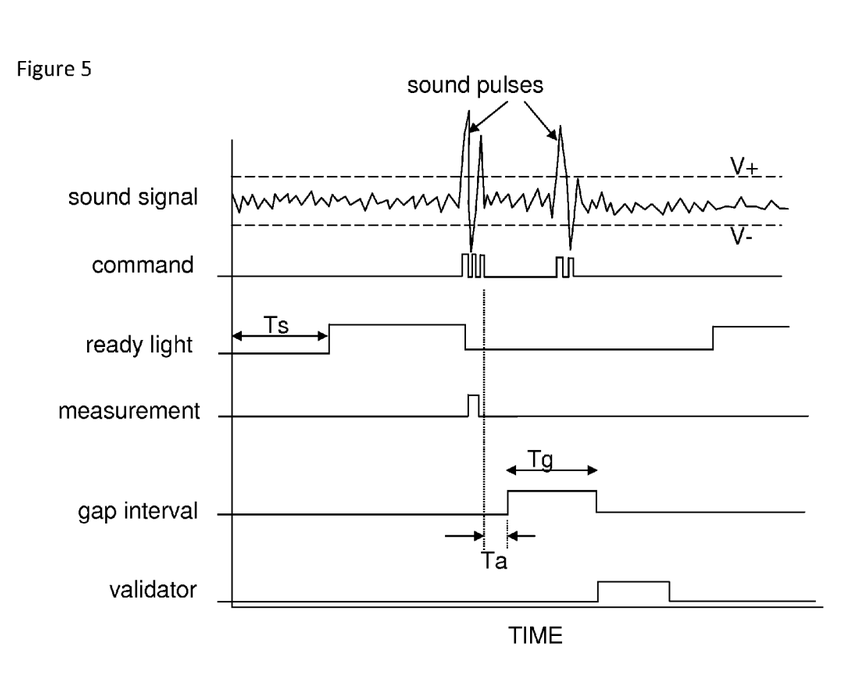
FIG. 5 is a chart showing the sequence of intervals in a command response.

FIG. 5 is a chart showing the sequence of intervals in the inventive command response method. At the top of the chart is a graph of the amplified sound signal versus time. The sound plot includes the two sound pulses comprising a type 2 command. The positive and negative threshold values V+ and V− are shown as dashed lines. The second trace labeled "command" indicates the times when the signal exceeds the threshold values and is interpreted as a spoken command. Sound is detected as a command whenever the signal exceeds the threshold. When the signal remains between the V+ and V− values, no sound is detected, and the signal comprises background noise or relative silence.

The next trace in FIG. 5, labeled "ready light", shows when the instrument is ready to receive a voice command. Initially, the instrument is not ready because it is waiting for a silence period Ts to complete. During the silence period, no sound exceeding the threshold values should be detected; and if a sound is detected, then the silence period starts over. Here Ts is 200 msec, which is long enough to ensure that prior commands or noise excursions are complete, but not so long that the system becomes balky.

Then, after the silence period is satisfied, the ready light turns on indicating to the user that the system is waiting for a command.

When the first sound pulse occurs, the ready light turns off. The ready light remains off until the completion of the command response plus an additional Ts period of silence.

The next trace in FIG. 5, labeled "measurement", shows when the selected measurement is performed, such as incrementing a counter, or gating a timer, or reading a weight or a distance value. The selected measurement is performed immediately following the first sound detected after the Ts silent period. Optionally, the measurement could be performed after a fixed delay or at the completion of the command interpretation scheme.

The next trace in FIG. 5, labeled "gap interval", shows a predetermined period Ta following the first sound pulse, Ta being indicated by vertical dotted lines. No additional sound should be detected during the Ta period. If another sound occurs during the Ta time, the interval is restarted. This continues until the Ta time expires with no additional sounds detected. In this way the system finds the end of the first sound pulse. Here Ta is 30 msec, which is long enough to catch any further sound waves comprising the first syllable, but short enough that the second sound pulse will not be interpreted as a continuation of the first sound pulse.

A predetermined gap period Tg then starts at the end of Ta. During Tg, the system listens for a second sound pulse. If no second sound pulse is detected by the end of Tg, then the command is a type 1. If a second sound pulse is detected before the end of Tg, as shown in the figure, then the command is type 2. Here Tg is 200 msec, which is long enough to accommodate the second syllable of a spoken Reset command, even if the operator speaks slowly, but short enough that two type 1 commands are never interpreted as a type 2 command.

The next trace in FIG. 5, labeled "validator", shows the command-validation indicator such as an LED flash or an acoustical tone, which indicates to the user that a valid command has been received.

After the end of the command-validation indicator pulse, plus an additional Ts period of silence, the ready light again turns on and the system is ready to receive the next command.

Figure 6:
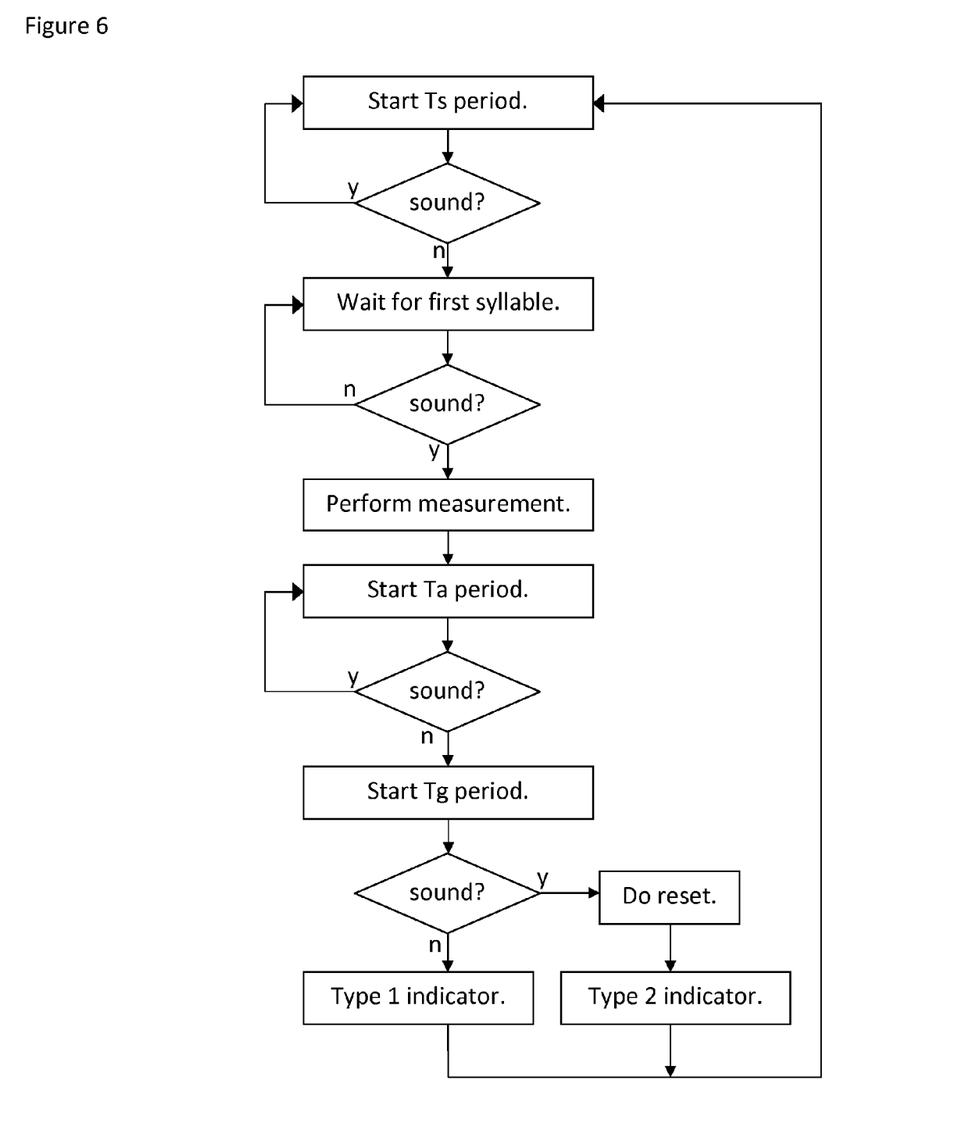
FIG. 6 is a flowchart showing the steps of the inventive method.

FIG. 6 is a flowchart showing the various timing loops of the inventive method for performing voice-controlled measurements. The instrument begins by waiting a time Ts for background noise to settle. If any sound is detected above background during this time, as indicated by the interrogator labeled "sound?", then the interval is started over, continuing until a full Ts period of silence is obtained.

Then in the box labeled "Wait for first syllable", the instrument monitors the amplified microphone signal for any sound above threshold. When such a sound is detected, the selected measurement is performed. The particular measurement depends on the application, and may involve incrementing a tally count, toggling a timer on or off, or recording a voltage value or a weight or a distance value for example.

Then in the box labeled "Start Ta period" the instrument seeks the end of the first command sound by measuring a time period Ta, and if any sound is detected during that time, it restarts the period, continuing until a full Ta interval expires with no sound detected.

Then the instrument seeks a second sound in an interval Tg. If a second sound pulse is detected during that time, then the command is a type 2 command and the system performs a reset function. If no sound is detected during Tg, then the command is a type 1 command and no such reset is performed.

The system then generates a command validation indicator such as an LED flash or an acoustical tone, the indicators being different for type 1 and type 2 commands. After the respective indicator, the system again seeks an initializing period of silence and starts over.

Optionally, the method includes an additional step of measuring background noise, such as the amplitude of the amplified signals, and adjusting the threshold higher in high noise environments, or lower (that is, more sensitive) in quieter environments. The adjustment may proceed continuously; or it may be interrupted whenever a command sound is detected, thereby preventing the command sound from unduly influencing the threshold adjustment.

The embodiments and examples provided herein illustrate the principles of the invention and its practical application, thereby enabling one of ordinary skill in the art to best utilize the invention. Many other variations and modifications and other uses will become apparent to those skilled in the art, without departing from the scope of the invention, which is to be defined by the following claims.

What is claimed is:

1. A system comprising a sound receiver, a signal analyzer, a measurement device, and a communicator wherein:
   the sound receiver comprises a transducer converting sound energy to electrical signals;
   the signal analyzer comprises a processor configured to analyze the signals, and to identify therein a spoken command of type 1 having a single period of voiced sound, and to activate the measurement device responsive to the type 1 command, thereby producing a measured value;
   the signal analyzer is configured to recognize a spoken command of type 2 having two periods of voiced sound separated by a period of substantially less voiced sound, and to reset the measured value responsive to the type 2 command;
   and the communicator is configured to communicate the measured value by visually displaying or acoustically announcing or electronically transmitting the numerical value.

2. The system of claim 1 wherein the sound receiver includes amplification means with a gain of about 40 dB to about 100 dB, and bandpass filtering means having a low-frequency cutoff between about 10 Hz and 100 Hz and a high-frequency cutoff between about 500 Hz and 1500 Hz.

3. The system of claim 1 wherein resetting the measured value comprises setting the measured value to zero.

4. The system of claim 1 wherein the measurement device is an electronic counter configured to increment when activated responsive to a type 1 command, the measured value thus comprising the number of type 1 commands.

5. The system of claim 1 wherein the measurement device is an electronic counter configured to count pulses from a clock generator, and to alternately start and stop such counting responsive to type 1 commands, thereby measuring a time interval between successive type 1 commands, which time interval comprises the measured value.

6. The system of claim 1 wherein the measurement device is configured to measure one of: a distance, or a weight, or a voltage, or a temperature, or a light intensity, or a field value.

7. The system of claim 1 which enables a readiness indicator when the system is ready to receive a spoken command, and which disables the readiness indicator when the system is not ready to receive a spoken command.

8. The system of claim 1 which further includes a running mode and a holding mode, the system being configured to receive and respond to spoken commands when in running mode, and to ignore all spoken commands when in holding mode.

9. The system of claim 1 which is further configured to ignore any subsequent type 1 commands, after performing the measurement, until reset by a type 2 command, thereby holding the measured value constant until so reset.

10. The system of claim 1 which further includes a multifunction switch comprising a momentary-type pushbutton switch configured to perform multiple functions wherein:
   if the switch is pressed while power to the system is off, the switch turns on the power;

if the switch is pressed for a time interval of T1 or less, while the power is on, the switch causes the system to alternately suspend operation and resume operation;

if the switch is pressed for a time interval greater than T1 but less than T2, while the power is on, the switch causes the system to reset the measured value;

if the switch is pressed for a time interval greater than T2 but less than T3, while the power is on, the switch causes the power to turn off.

11. The system of claim 10 wherein T1 is less than about 200 milliseconds, T2 is greater than T1 and less than about 1 second, and T3 is greater than T2 and less than about 5 seconds.

12. A method for performing a measurement and resetting a measurement result responsive to voice commands, the method comprising the steps:

waiting until no sound is detected for a predetermined period Ts;

then, waiting until a first sound is detected, thereby indicating that a voice command is detected;

then, performing the measurement, thereby producing a measured value, and communicating the measured value by means of a visual display or an acoustical message or an electronic signal;

and waiting until no sound is detected during a period Ta, thereby indicating that the first sound is complete;

then, waiting for a period Tg, the command being of type 1 if no sound is detected during Tg, and the command being of type 2 if a second sound is detected during Tg;

and resetting the measured value responsive to a command of type 2.

13. The method of claim 12 wherein Ts is about 50 to 500 milliseconds, Ta is about 10 to 100 milliseconds, and Tg is about 50 to 500 milliseconds.

14. The method of claim 12 which includes, following each command of type 1, holding the measured value constant thereafter until being reset by a command of type 2 or by a button press.

15. The method of claim 12 wherein resetting the measured value comprises setting the measured value to zero.

16. The method of claim 12 which further includes producing a first confirmation indicator following a type 1 command, and producing a second confirmation indicator, distinct from the first confirmation indicator, following a command of type 2, the two confirmation indicators thereby indicating the type of voice command detected.

17. The method of claim 12 which further includes enabling a readiness indicator that indicates when voice commands may be received, the readiness indicator being enabled after the period Ts expires with no sound detected therein, and the readiness indicator being disabled whenever any sound is detected above threshold.

18. The method of claim 12 which further includes comparing the signals to two threshold values V+ and V−, with V+ being more positive than V−; and a sound being detected when the signals are greater than V+ or less than V−; and no sound being detected when the signals remain between V+ and V−.

19. The method of claim 12 wherein performing the measurement comprises one of:

incrementing a counter, the measured value being a count total equal to the number of voice commands detected;

or starting and stopping a counter in alternation, the counter being configured to count pulses from an oscillator, thereby producing a measured value proportional to a time interval between successive voice commands;

or performing a distance measurement or a voltage measurement or a temperature measurement or a light intensity measurement or a field measurement at a particular time determined by the voice command.

\* \* \* \* \*